United States Patent [19]

Meyer

[11] 4,055,887
[45] Nov. 1, 1977

[54] METHOD FOR PRODUCING A STABILIZED ELECTRICAL SUPERCONDUCTOR

[75] Inventor: Gundolf Meyer, Birmenstorf, Switzerland

[73] Assignee: BBC Brown Boveri & Company Limited, Baden, Switzerland

[21] Appl. No.: 654,897

[22] Filed: Feb. 18, 1976

[30] Foreign Application Priority Data

Mar. 26, 1975 Switzerland .................. 3865/75

[51] Int. Cl.² .......................................... H01V 11/00
[52] U.S. Cl. ................................. 29/599; 29/419 R
[58] Field of Search ................................. 29/599, 419

[56] References Cited

U.S. PATENT DOCUMENTS

| | | | |
|---|---|---|---|
| 3,618,205 | 11/1971 | Barber et al. | 29/599 |
| 3,643,001 | 2/1972 | Schaetti | 29/599 |
| 3,743,986 | 7/1973 | McInturff et al. | 29/599 |
| 3,930,903 | 1/1976 | Randall et al. | 29/599 |

FOREIGN PATENT DOCUMENTS

| | | | |
|---|---|---|---|
| 2,345,779 | 9/1973 | Germany | 29/599 |
| 1,394,724 | 5/1975 | United Kingdom | 29/599 |
| 1,199,548 | 7/1970 | United Kingdom | 29/599 |

OTHER PUBLICATIONS

Harwell Industrial Services, "Niobium-Tin Superconducting Wires," 1973, pp. 1,2 and attachment pp. 1-4.

Primary Examiner—Michael J. Keenan
Attorney, Agent, or Firm—Pierce, Scheffler & Parker

[57] ABSTRACT

A method of producing a stabilized electrical superconductor wherein a longitudinally extending slug is provided, the slug including a matrix such as bronze within which are embedded a multiplicity of wires or rods of a material such as niobium into which the tin in the bronze is diffused to convert the niobium into a superconductor. The matrix is surrounded by a ring of wires or rods of a material such as copper having a high electrical conductivity characteristic, forming an electrically parallel connection with the superconductors which provides a bridge of good electrical conductivity in the event the superconductivity of the superconductor is lost for any reason and each of these latter wires or rods is surrounded by a high resistance layer such as a copper-nickel alloy, which, in turn, is surrounded by a diffusion inhibiting layer such as tantalum to prevent diffusion of the tin from the bronze matrix into the copper wires or rods which would otherwise reduce their electrical conductivity.

The slug is then drawn to convert the various wire or rod components within it into filamentary form, and diffusion of the tin into the niobium to convert the latter into a superconductor is effected by annealing.

8 Claims, 3 Drawing Figures

METHOD FOR PRODUCING A STABILIZED ELECTRICAL SUPERCONDUCTOR

This invention relates to a method for producing a stabilized superconductor containing a plurality of filaments of super-conductive material, in which a composite parent slug is mechanically deformed to achieve intimate metallic connection between the individual slug constituents with the aid of heat treatment followed by the formation of superconductive filaments by the diffusion of at least one diffusible material component in the matrix into a second material component disposed in filament form in the interior of the conductor.

The prior art already discloses numerous filamentous superconductors based on intermetallic compounds such as $Nb_3Sn$, $V_3Ga$, $V_3Si$ and others, their common characteristics being very high critical fields ($>15T$), high critical temperatures ($>15K$) and high critical current densities in the superconductor material ($>10^6 A/mm^2$ at 5T and 4.2K). However, the superconductor materials employed to this end are all very brittle and cannot be drawn by known methods into the required thin filaments. In producing the superconductors it is therefore necessary to first deform the ductile material components, where appropriate to add specific material components only when the end product is formed and to produce the intermetallic compound by diffusion with the aid of an annealing process.

Several methods have already been disclosed for performing such processes. In one known method, Nb rods are drawn to thin diameters and the end product is passed through a bath of molten tin at a temperature of approximately 1000° C so that a $Nb_3Sn$ film is formed in the surface region of the Nb filament. The disadvantage of this method is that the intermetallic superconductor compound is formed at a high rate so that it receives a coarse-grained structure, resulting in low critical current values.

According to another known method, V-rods are inserted into a matrix comprising gallium bronze, the entire assembly being deformed together to the final diameter, followed by the formation of a $V_3Ga$ film in the surface region of the vanadium filaments by subsequent internal diffusion at a temperature of approximately 650° C obtained by diffusion annealing. The advantage compared with the first-mentioned method is the lower growth rate and therefore the fine-grained structure of the $V_3Ga$ film obtained by internal diffusion by contrast to immersion in a Ga bath by analogy to the first-mentioned method which produces a conductor with a substantially higher critical current density and prevents the formation of undesirable side phases.

According to a third known method, Nb rods are inserted into a copper matrix, the entire assembly being then deformed and after obtaining the final diameter the wire is coated with tin and the tin is allowed to diffuse externally at a temperature of 700° C through the copper to the filaments of niobium so that a $Nb_3Sn$ film is formed at least in the surface region of the niobium filaments. The advantage of this method compared with the second-mentioned method is that the matrix of copper and niobium can be drawn relatively simply while a Ga or Sn bronze would call for constant soft annealing of the wire during drawing, more particularly at the high Ga or Sn concentrations required to form a superconductor material, a feature which is very awkward, time-consuming and costly.

The disadvantage of all the methods mentioned above is that the residual matrix consists not only of the superconductive film and the residual core of the superconductor filaments, but also of the CuGa, CuSn or CuSi bronze of very poor electrical conductivity. However, to ensure stable and non-hazardous operation of a superconductor coil it is necessary to connect the conductor to a copper, aluminium or silver parallel conductor which then represents a bridge of good electrical conductivity in the event that the superconductivity of the superconductor is lost for any reason. It is advantageous if high-conductivity copper, aluminium or silver is integrated into the matrix of the superconductor. According to examples already known, the filaments or filament groups consisting of super-conductive material and also containing the bronze matrix are surrounded by diffusion barriers which are impermeable for the diffusing components, for example Sn, Ga or Si. The interior of such conductors therefore contains the super-conductive films surrounded by the bronze matrix which in turn is surrounded by a diffusion barrier and the last-mentioned barrier is surrounded on the exterior by copper or aluminium of good electrical conductivity. However, a conductor of this kind is unsuitable for use in rapidly changing fields.

On the other hand, the advantages of internal diffusion compared with external diffusion are as follows:

a. improved deformability of the matrix together with the rods or wires which consist of the second material component that forms the super-conductive material and is to be drawn into filaments because of the improved metallurgical bonding between the matrix and the last-mentioned rods or wires. There is also better adaptation of the hardnesses in the parent slug and therefore more homogeneous deformation.

b. Elimination of the rather complex method of inward diffusion, usually a multi-stage diffusion process.

It is the object of the invention to provide a method for producing a stabilized superconductor with minimum losses in all its spatial regions and suitable for use in magnetic fields which alter rapidly.

The method according to the invention is characterized in that the middle region of the cross-section of the parent slug is provided with a plurality of rods or wires consisting of the second material component which is to form the superconductive material, said rods or wires being surrounded by a material containing the diffusible material component, and the radially outer region is provided with a plurality of wires or rods of material with good electrical conductivity, each of said wires or rods, or groups thereof, being surrounded with a material which forms a barrier to the diffusible material component and by a high-resistance stratum which separates them.

The selection of the materials, the geometrical shape and size of the components and their spatial arrangement in the conductor cross-section must be selected appropriately so that the overall electric resistance between any two filaments of super-conductive materials, more particularly between two filaments situated at a distance from each other, is as high as possible while maintaining the highest possible superconductor cross-section and a cross-section of material of normal conductivity, for example copper, which extends along the conductor and has a cross-section which is sufficiently large for the protection thereof.

The use of the method according to the invention ensures that a substantial number of filaments which extend parallel to the longitudinal axis of the conductor and consist of material of good conductivity are protected by barrier layers against inward diffusion of diffusible material components contained in the matrix, the individual filaments of material of good electrical conductivity being insulated from each other by high-resistance layers which have a sufficiently high electrical resistance to permit eddy currents to decay sufficiently rapidly but nevertheless being able to function as a shunt for the electric current which flows in the superconductor filaments.

To protect the outside of the conductor against inward diffusion of the diffusible components, it is appropriate if the rods or wire, consisting of material of good electrical conductivity and being surrounded by the high-resistance diffusion barrier material, are arranged in directly adjacent configuration so that they form a closed ring around the rods or wires consisting of the second material component which forms the superconductive material.

The use of the method according to the invention also provides the following advantages:

a. It is not impossible for openings to occur, due to cracks, pores or the like, in the diffusion barriers which are disposed around the material of good electrical conductivity and are to be as thin as possible, given a final length of the conductor of many kilometers. At these places in previous embodiments tin could diffuse into the copper from the conductor part containing bronze to destroy the high electrical conductivity of the copper. As a consequence, the conductor could burn through in the event of rapid de-energization of a coil manufactured from the known superconductor or in the event of a sudden loss of super-conductivity in the conductor which it must be able to withstand. When using the method according to the invention, the distribution over the cross-section of material of good electrical conductivity, for example copper, into several regions which are separated from each other and are protected by diffusion barriers practically precludes the entire cross-section or a substantial part of the material of good electrical conductivity from becoming a poor electrical conductor.

b. The distribution of the cross-section of material of good electrical conductivity into several regions at a distance from each other obtained by the use of the method according to the invention results in a reduction of eddy current losses when the conductor is used in fields which vary with respect to time. Moreover, bridges of poor electrical conductivity disposed between regions of good electrical conductivity also reduce the known coupling losses between superconductor filaments situated at the greatest distance from each other and copper regions.

Examples of the invention will be explained by reference to the accompanying drawings, in which.

Figure 1:
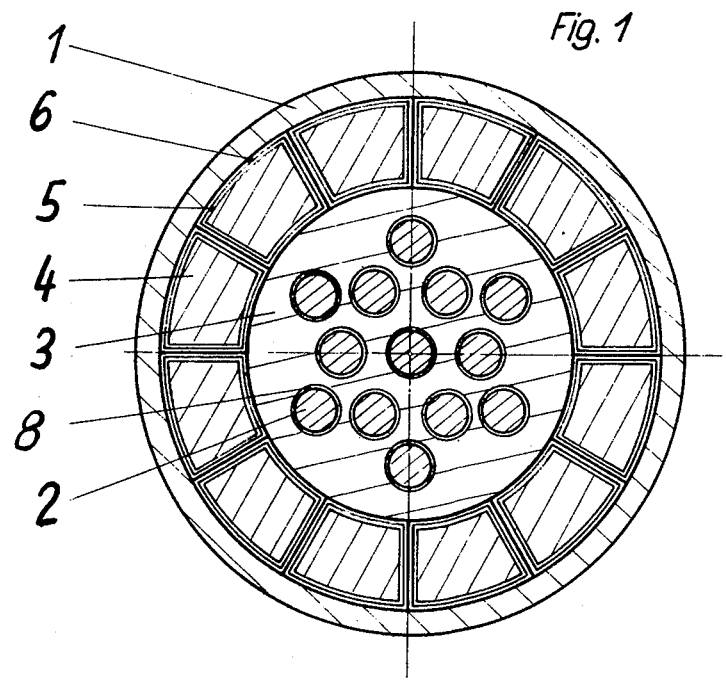
FIG. 1 is a cross-section through a first embodiment of a parent slug for performing the method according to the invention.

As can be seen by reference to FIG. 1, shaped components comprising cylindrical Nb rods 2, a cylindrical bronze block 3 provided with bores for accommodating the Nb rods 2, copper rods 4 in the form of segments of an annulus and respective sleeves surrounding the copper rods 4 and consisting of a high-resistance copper-nickel alloy 5 and a diffusion-blocking Ta layer 6, are inserted into a hollow cylinder 1 of material of poor electrical conductivity, the alloying constituents of which are non-diffusible at diffusion annealing temperatures in the region between 500° and 900° C, and consisting, for example, of a copper-nickel alloy, brass or copper-aluminium alloy. Both ends of the hollow cylinder 1 are closed by cover discs, not shown, and the cylinder is evacuated where appropriate and subsequently hot and/or cold-worked into a wire containing Nb filaments, with intermediate anneals if necessary for softening the bronze. The super-conductive compound $Nb_3Sn$ is formed by subsequent annealing of the aforementioned wire at a temperature in the region between 500° and 900° C to cause diffusion of the diffusible component Sn from the bronze block 3 into the surface of the Nb filaments.

To reduce the cross-sectional proportion of material with poor electrical conductivity, the hollow cylinder 1, consisting of material of poor electrical conductivity, can be removed, for example by pickling in acid.

Figure 2:
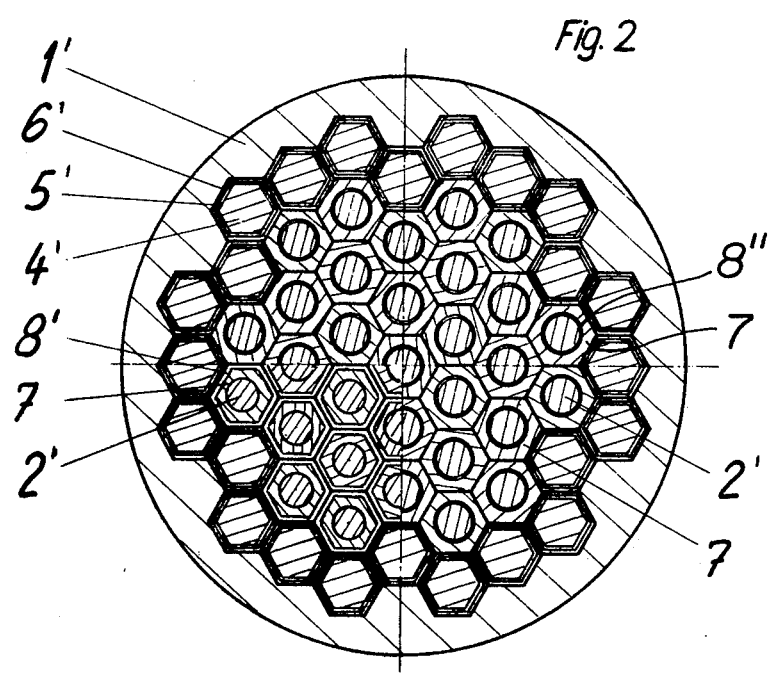
FIG. 2 is a cross-section through a second embodiment of a parent slug.

In the second embodiment, illustrated in FIG. 2, shaped components, comprising cylindrical Nb rods 2', hexagonal bronze tubes 7 surrounding the latter, hexagonal copper rods 4' and a sleeve surrounding the latter and consisting of a high-resistance copper-nickel alloy 5' and a diffusion-blocking Ta layer 6' are inserted into a hollow cylinder 1' which consists of brass. Further processing is then performed as in the embodiment described with reference to FIG. 1.

Superconductors based on $Nb_3Sn$, $V_3Ga$, $V_3Si$ or other similar compounds can be produced in accordance with FIG. 1 and FIG. 2.

The Nb rods 2 can be surrounded with bronze in a preceding process step and the Cu rods 4 can likewise be surrounded with the high-resistance and diffusion-blocking material in a preceding process step.

Rods produced in a preceding process step from Nb rods embedded in a Cu or bronze matrix can be used in place of the Nb rods 2 and possibly also instead of the bronze tubes 7 (according to FIG. 2). In some cases, it can be appropriate, especially for a particularly effective reduction of the eddy current losses, if the said rods, containing a plurality of Nb filaments, are surrounded with a high-resistance layer 8 or 8', as shown in FIGS. 1 and 2.

The copper rods 4 can also be surrounded by a material which is simultaneously of high resistance and is diffusion-blocking with respect to the diffusible material component, for example they can be surrounded with a TaV alloy when forming $Nb_3Sn$ filaments, or they can be surrounded with a TaNb alloy when forming $V_3Ga$ filaments.

If desired, each of the rods 43 which are covered, respectively with a diffusion-inhibiting layer, can be further subdivided to form a group of rods of smaller cross-section and each of the latter is surrounded by a high-resistance layer so as to minimize eddy current losses when the conductor is used in alternating current fields. The material 1 disposed on the outside must either be of high resistance or must be converted on the finished conductor into a high-resistance layer unless it is removed. Conversion into a high-resistance layer can be effected by diffusing an alloying component into it, for example by the diffusion of tin into copper.

Figure 3:
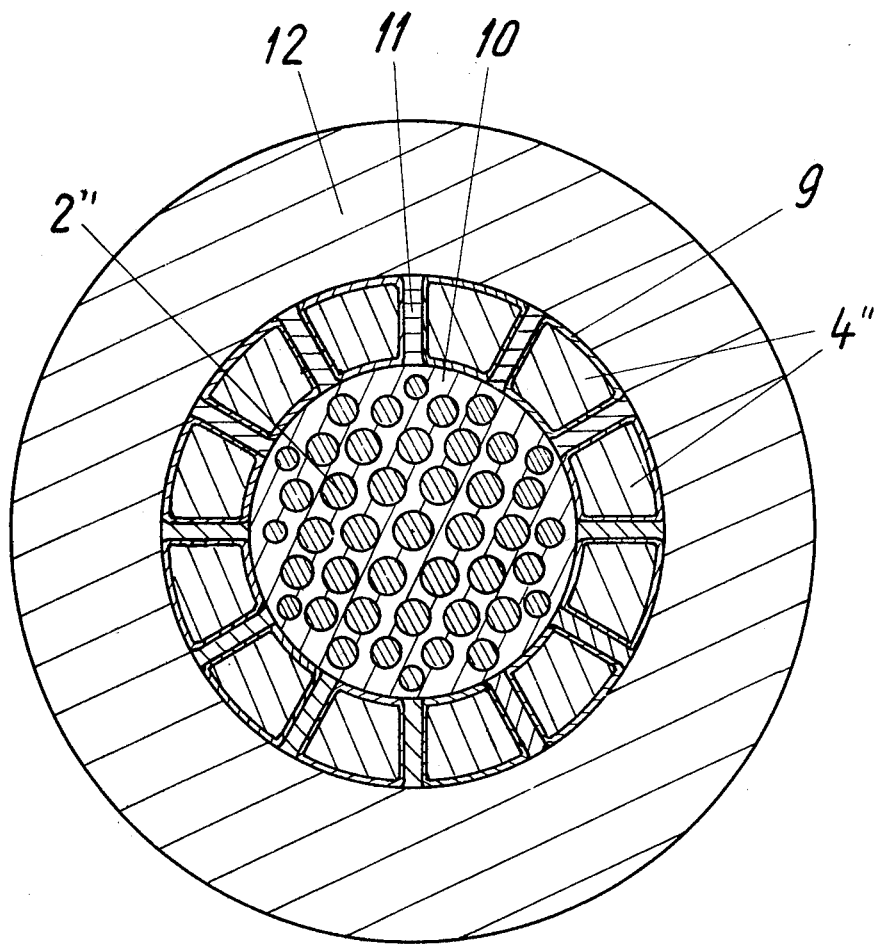
FIG. 3 is a cross-section through a third embodiment of a parent slug.

To obtain diffusion bridges, it is also possible, as can be seen by reference to FIG. 3, that the rods 4" which consist of material of good electrical conductivity and are surrounded by high-resistance diffusion-blocking material 9, are spaced from each other, the matrix 10, 11, and 12 containing the diffusible component extending between as well as inside and outside the rods 4", so that the principal part of the matrix containing the diffusible component is situated on the outside of the parent slug. The diffusible material component which is situated in the matrix parts 10, 11 and 12 is thereafter diffused into the rods 2" by the applicaton of heat treatment and the principal part 12 of the matrix situated on the outside of the finished conductor is removed, for example by pickling in acid. As in the case of the embodiment illustrated in FIG. 1, if the rods 2" are made from Nb the matrix component 10 and 11 will be made from bronze. The matrix components 10, 11, and 12 can be made separately, as illustrated.

The advantage of this method is that the proportion of superconductor cross-section in relation to the overall cross-section of the finished conductor could be substantially increased by contrast to previous methods with internal diffusion because the matrix part 10, situated in the interior of the parent slug, need not be dimensioned as substantially as hitherto so that it contains the entire quantity of diffusible material component.

I claim:

1. A method for producing a stabilized super-conductor containing a plurality of thin filaments of super-conductive material, in which a composite parent slug is mechanically worked to achieve metallurgical bonding between all of the individual components of the slug followed by annealing to effect formation of super-conductive filaments by diffusion of at least one diffusible material component contained in a matrix material included in the slug into a second material component disposed in filament form in the interior of the conductor, characterized in that a middle region of the cross-section of the slug is constituted by a plurality of rods or wires consisting of the material component which forms the second, super-conductive material and a surrounding material containing the diffusible material component, and said middle region is surrounded by a contiguous ring of rods or wires of a material having a good electrical conductivity and each of which is individually surrounded by contiguous material which forms a barrier to the diffusible material component and also provides high electrical resistance therebetween.

2. A method according to claim 1 and wherein each of said rods or wires consisting of the material component which forms the second, super-conductive material is surrounded by a layer of material containing the diffusible material component which in turn is surrounded by a layer of high resistance material.

3. A method according to claim 1 and wherein the material which surrounds each of said rods or wires of good electrical conductivity has both the properties of high electrical resistance and a barrier to the diffusible material component.

4. A method according to claim 1 and wherein the material which surrounds each of said rods or wires of good electrical conductivity is constituted by one layer having a high electrical resistance and another layer forming a barrier to the diffusible material component.

5. A method according to claim 1 and wherein the rods or wires of a material having a good electrical conductivity are initially enclosed within an outer contiguous cylinder of high electrical resistance material.

6. A method according to claim 1 wherein the rods or wires of a material of good electrical conductivity and which are surrounded by high-resistance and diffusion-blocking material are spaced slightly apart in a circumferential direction, and wherein the matrix material containing the diffusible material component is arranged between as well as radially within and without the rods or wires of material of good electrical conductivity in such manner that the principal part of the material is situated outwardly from the latter and is removed after completion of the diffusion.

7. A method according to claim 6 wherein said outer contiguous cylinder of high electrical resistance material is removed by pickling with acid.

8. A method according to claim 1 and wherein each of said rods or wires consisting of the material component which forms the second, super-conductive material is surrounded by a layer of high resistance material which in turn is surrounded by the matrix material containing the diffusible material component.

* * * * *